US006177802B1

(12) United States Patent
Shabde et al.

(10) Patent No.: US 6,177,802 B1
(45) Date of Patent: Jan. 23, 2001

(54) SYSTEM AND METHOD FOR DETECTING DEFECTS IN AN INTERLAYER DIELECTRIC OF A SEMICONDUCTOR DEVICE USING THE HALL-EFFECT

(75) Inventors: Sunil N. Shabde, Cupertino; Yowjuang William Liu, San Jose; Ting Yiu Tsui, Palo Alto, all of CA (US)

(73) Assignee: Advanced Micro Devices, Inc., Sunnyvale, CA (US)

( * ) Notice: Under 35 U.S.C. 154(b), the term of this patent shall be extended for 0 days.

(21) Appl. No.: 09/131,918

(22) Filed: Aug. 10, 1998

(51) Int. Cl.[7] .................................................. G01R 31/12
(52) U.S. Cl. .......................... 324/537; 324/501; 324/750; 324/765; 324/602; 324/603; 324/719
(58) Field of Search ..................................... 324/500, 501, 324/512, 522, 523, 527, 531, 537, 750, 752, 765, 766, 551, 602, 603, 719, 71.5

(56) References Cited

U.S. PATENT DOCUMENTS

| | | |
|---|---|---|
| 4,144,493 * | 3/1979 | Lee et al. ............................. 324/765 |
| 4,943,539 | 7/1990 | Wilson et al. . |
| 5,025,300 | 6/1991 | Billig et al. . |
| 5,302,233 | 4/1994 | Kim et al. . |
| 5,382,547 | 1/1995 | Sultan et al. . |
| 5,444,026 | 8/1995 | Kim et al. . |
| 5,475,695 | 12/1995 | Caywood et al. . |
| 5,514,245 | 5/1996 | Doan et al. . |
| 5,548,224 * | 8/1996 | Gabriel et al. ....................... 324/765 |
| 5,550,405 | 8/1996 | Cheung et al. . |
| 5,570,034 * | 10/1996 | Needham et al. .................... 324/763 |
| 5,610,405 | 3/1997 | Inushima et al. . |
| 5,665,199 | 9/1997 | Sahota et al. . |
| 5,670,777 | 9/1997 | Inushima et al. . |
| 5,686,761 | 11/1997 | Huang et al. . |
| 5,710,460 | 1/1998 | Leidy et al. . |
| 5,717,215 | 2/1998 | Inushima et al. . |

\* cited by examiner

Primary Examiner—Glenn W. Brown
(74) Attorney, Agent, or Firm—Amin, Eschweiler & Turocy, LLP

(57) ABSTRACT

A system for detecting defects in an interlayer dielectric (ILD) interposed between first and second conductive lines lying adjacent each other along a first plane is provided. A processor controls general operations of the system. A voltage source adapted to apply a bias voltage between the first and second conductive lines is employed to induce a leakage current across the ILD. A light source for illuminating at least a portion of the ILD is used to enhance the leakage current. A magnetic field source applies a magnetic field in a direction orthogonal to the leakage current. The magnetic field deflects carriers in a direction substantially perpendicular to the first plane. A voltage monitor measures a voltage generated across third and fourth conductive lines, the third and fourth conductive lines lying adjacent each other along a second plane which is substantially perpendicular to the first plane. The voltage monitor is operatively coupled to the processor. The ILD is interposed between the third and fourth conductive lines. The processor determines the existence of a defect in the ILD based on the measured voltage.

29 Claims, 11 Drawing Sheets

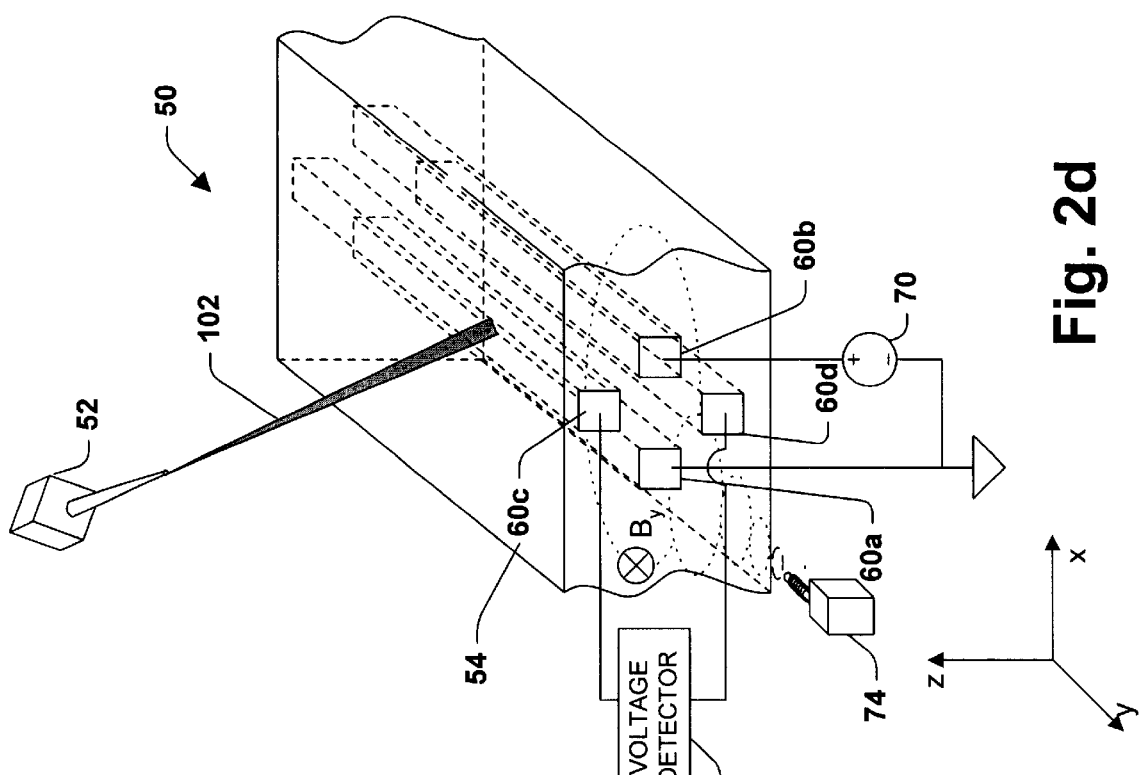
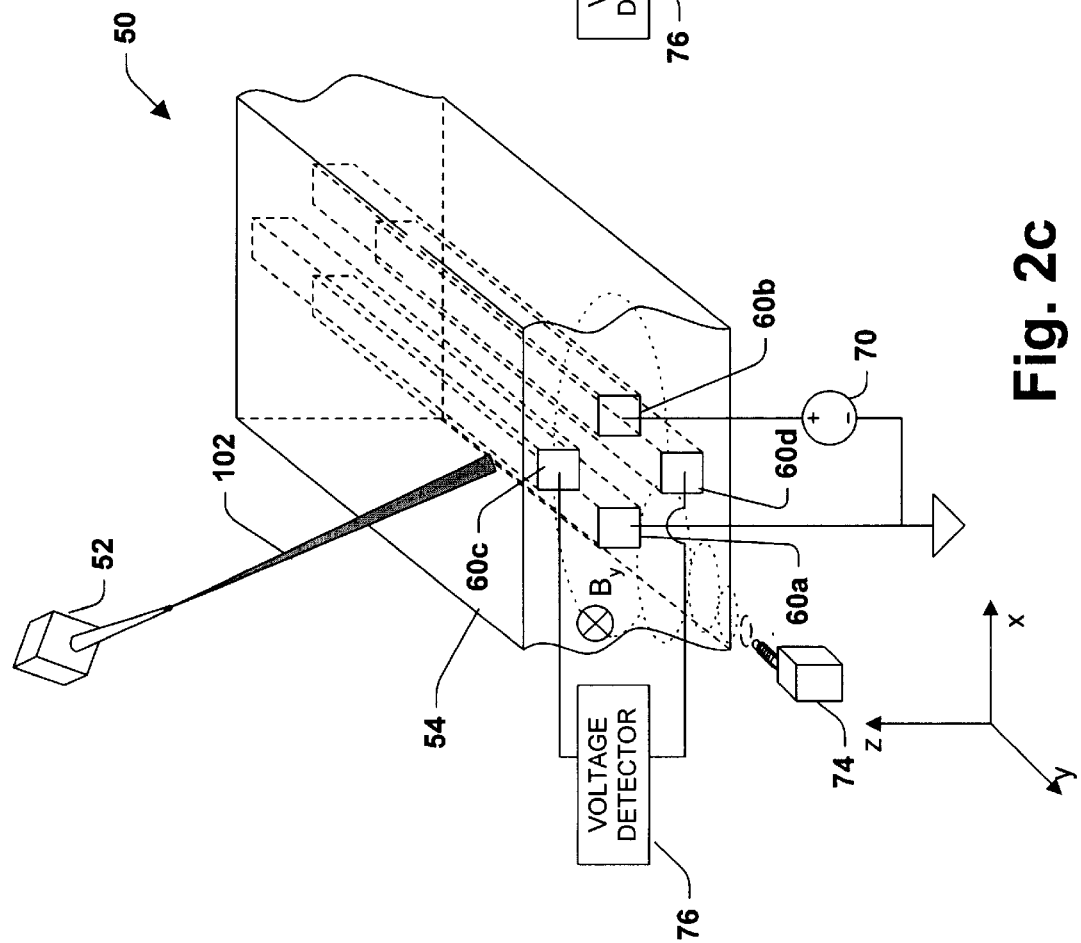

US 6,177,802 B1

SYSTEM AND METHOD FOR DETECTING DEFECTS IN AN INTERLAYER DIELECTRIC OF A SEMICONDUCTOR DEVICE USING THE HALL-EFFECT

TECHNICAL FIELD

The present invention generally relates to a system and method for detecting defects in an interlayer dielectric interposed between conductive lines of a semiconductor device, and more particularly relates to enhancing carriers in the dielectric and deflecting the carriers toward the dielectric surface via the Hall-effect.

BACKGROUND OF THE INVENTION

There is an increasing demand for miniaturization in the integrated circuits industry. This demand has led to an ever constant reduction in separation between conductive lines (e.g., metal lines) in order to reduce integrated circuit size and/or increase density. The reduced spacing between the conductive lines has the undesirable effect of increasing the capacitance of whatever material lies between the conductive lines. This phenomenon is known as capacitive crosstalk.

In the past, overall integrated circuit (IC) performance depended primarily on device properties; however, this is no longer the case. Parasitic resistance, capacitance and inductance associated with interconnections and contacts of an IC are beginning to become increasingly significant factors in IC performance. In current IC technology, the speed limiting factor is no longer device delay, but the resistive-capacitive (RC) delays associated with the conductive interconnections (e.g., metal lines) of the IC.

Conventional ICs typically employ an interconnect structure wherein a first conductive line is adjacent a second conductive line. If the crosstalk or capacitance between the first conductive line and the second conductive line is high, then the voltage on the first conductive line alters or affects the voltage on the second conductive line. This alteration in voltage may result in the IC being inoperable as a result of misinterpreting logic zeros, logic ones and voltage levels, and consequently incorrectly processing binary and/or analog information.

In order to reduce capacitive coupling and therefore reduce capacitive crosstalk, low dielectric constant (low-K) materials have been developed to lie between conductive lines in order to insulate one conductive line from the other.

FIG. 1 illustrates a portion of a typical integrated circuit. An insulating layer is formed on a semiconductor substrate, both the insulating layer and substrate are generally indicated at 20. A conductive pattern 22 including conductive lines 24 is formed over the insulating/substrate layer 20. The conductive lines 24 are separated by interwiring spaces 26 formed on the insulating/substrate layer 20. A dielectric material 30 (e.g., silicon dioxide, spin on glass) is shown deposited over the conductive lines 24 and the interwiring spaces 26 so as to form an insulative barrier 32 (interlayer dielectric) between the conductive lines 24.

Dielectric materials such as silicon dioxide are susceptible to ion contamination and moisture penetration. Furthermore, current deposition and polishing techniques have not reached a level where contamination of the interlayer dielectric (ILD) is eliminated. Additionally, voids within the ILD may result due to an imperfect fabrication process. Contaminants are undesirable in the ILD because the contaminants may degrade the performance of the ILD and facilitate unwanted capacitive crosstalk (e.g., leakage) between adjacent metal lines. Voids are not desired because the voids weaken the ILD and may lead to the formation of cracks within the ILD which may also give rise to leakage of current between adjacent conductive lines.

Detection of such defects (e.g., lattice defects, dislocations, impurities, contaminants and voids) is typically performed at the end of the process line after the IC is substantially complete. However, the in-line fabrication of the IC represents up to 95% of the cost of the ultimate integrated circuit. Thus, it would be desirable to test the IC during fabrication in order to detect defects in the IC early on before additional monies and man hours are spent down the line for later fabrication steps.

In view of the above, it would be desirable to have a system and method for in-line detection of defects in the interlayer dielectric of an integrated circuit.

SUMMARY OF THE INVENTION

The present invention provides for a system and method for in-line detection of defects (e.g., lattice defects, dislocations, impurities, contaminants and voids) in an interlayer dielectric between adjacent conductive lines of an integrated circuit. More particularly, the present invention applies a bias voltage between a first set of conductive lines of an IC lying adjacent each other along a first plane so as to induce a leakage current to flow between the first set of conductive lines across the ILD separating the first set of conductive lines. The applied voltage is preferably applied at a level coincident with the operating voltage of the IC so as to avoid breakdown of any components of the IC. A radiation source or light source (e.g., ultraviolet (UV) laser) is applied at the portion of the ILD where leakage current flow is being induced. The light source provides for enhancing the flow of leakage current at the ILD portion being tested for defects. More particularly, by applying a light source (preferably UV) with an energy level greater than the energy barrier between the metal of the conductive lines and the dielectric ($\approx$3.2eV in the case of $SiO_2$) carriers are injected into the dielectric from the metal. This results in the leakage current flow being enhanced.

The biased ILD material is subjected to a magnetic field which is oriented in a direction orthogonal to the current path. The magnetic field deflects carriers associated with both the defects and light source toward a surface of the ILD in accordance with the Hall-effect. The deflected carriers, after reaching the ILD, form an accumulated charge profile in the vicinity of the ILD surface. The charge profile is manifested as a Hall voltage across a second set of conductive lines lying adjacent each other along a second plane perpendicular to the first plane. The ILD material being tested also being interposed between the second set of conductive lines.

The Hall voltage is measured using a Hall-voltage monitor operatively coupled to the second set of conductive lines. If defects (e.g., lattice defects, dislocations, impurities, contaminants and voids) are present within the portion being tested, the amount of leakage current flow will differ from an expected value if the defects were not present. This is because some types of defects may result in the presence of trapping sites within the ILD. As a result of the trapping sites less energy may be required to excite electrons across the band-gap than if the dielectric was free of trapping sites. The light source not being sufficient to excite carriers across the band-gap of the dielectric will generate carriers substantially only at the trapping sites. Accordingly, the presence of such type of defect in the ILD may increase the amount of current flowing across the dielectric as compared to if the defect were not present. Additionally, the defect site may create an energy barrier between the metal and dielectric which is less than 3.2 eV. In such a case, more carriers may be injected at the defect site. By selectively choosing the light energy to be less than 3.2 eV or close to 3.2 eV the impact on leakage current associated with a defective site as compared to a normal site is enhanced. With respect to voids, the amount of current flow detected will be less than if the voids were not present. Accordingly, the amount of leakage current is directly related to the amount of carriers activated or excited which in turn corresponds to the Hall voltage measured along the second set of conductive lines. By monitoring for a decrease in Hall voltage below an expected level the presence of voids may be determined. Thus, by monitoring for a change in Hall voltage above and/or below an expected level the presence of defects in the ILD may be detected. By selectively scanning the light source across a predefined mapping grid of the ILD and simultaneously monitoring Hall voltage, the location of the defect may be determined with substantial accuracy. Measuring the Hall voltage with a desired level of precision is substantially easier than measuring the leakage current directly with the same level of precision.

As demands for miniaturization increase, resulting in the need for moving conductive lines even closer together, the present invention may be employed to detect defects in an ILD of an integrated circuit early on and avoid performing continued fabrication steps on a defective IC. Thus, the present invention provides for a system and method which quickly detects defects in an ILD in a non-destructive manner during in-line processing with substantial resolution and accuracy.

One particular aspect of the present invention relates to a system for detecting defects in an interlayer dielectric (ILD) interposed between a first set of conductive lines lying adjacent each other along a first plane which includes: a processor for determining the presence of a defect in the ILD; and a leakage current inducement system for inducing a leakage current between the first set of conductive lines across the ILD. The system also includes a magnetic field source for applying a magnetic field in a direction orthogonal to the leakage current; and a monitor operatively coupled to the processor, the monitor monitoring a parameter at least related to the leakage current across a second set of conductive lines lying adjacent each other along a second plane, the second plane being substantially perpendicular to the first plane. The ILD being interposed between the second set of conductive lines. The processor determines the presence of a defect in the ILD based upon the monitored parameter.

In accordance with another aspect of the present invention, a system for detecting defects in an interlayer dielectric (ILD) interposed between first and second conductive lines lying adjacent each other along a first plane is provided. The system includes a processor which controls general operations of the system. The system also includes a voltage source adapted to apply a bias voltage between the first and second conductive lines to induce a leakage current across the ILD, and a light source for illuminating at least a portion of the ILD to enhance the leakage current. The system further includes a magnetic field source for applying a magnetic field in a direction orthogonal to the leakage current. The magnetic field deflects carriers in a direction substantially perpendicular to the first plane. The system additionally includes a voltage monitor to measure a voltage generated across third and fourth conductive lines, the third and fourth conductive lines lying adjacent each other along a second plane which is substantially perpendicular to the first plane. The ILD being interposed between the third and fourth conductive lines. The voltage monitor is operatively coupled to the processor. The processor determines the existence of a defect in the ILD based on the measured voltage.

Another aspect of the present invention relates to a method for detecting defects in an interlayer dielectric (ILD) interposed between first and second conductive lines, comprising the steps of: inducing a leakage current between the two conductive lines across the ILD; applying a magnetic field in a direction orthogonal to the leakage current so as to generate a Hall voltage across third and fourth conductive lines; measuring the Hall voltage value; and determining the presence of a defect based on the measured Hall voltage.

Yet another aspect of the present invention relates to a system for detecting defects in an interlayer dielectric (ILD) interposed between two conductive lines, including: means for inducing a leakage current; means for applying a magnetic field orthogonal to the leakage current; means for monitoring a Hall voltage generated by the magnetic field; and means for determining the presence of a defect in the ILD based upon the monitored Hall voltage.

Still yet another aspect of the present invention relates to a system for detecting a three-dimensional location of defects in an interlayer dielectric (ILD) interposed between first and second conductive lines lying adjacent each other along a first plane, including: a processor for controlling general operations of the system; a voltage source adapted to apply a bias voltage between the first and second conductive lines and induce a leakage current across the ILD; a light source for illuminating at least a portion of the ILD and enhancing the leakage current, the light source being selectably adjustable to incrementally apply a light beam at a desired wavelength from among a plurality of wavelengths; a magnetic field source for applying a magnetic field in a direction orthogonal to the leakage current, the magnetic field deflecting carriers in a direction substantially perpendicular to the first plane; a voltage monitor for measuring a voltage generated across third and fourth conductive lines, the third and fourth conductive lines lying adjacent each other along a second plane which is substantially perpendicular to the first plane, the voltage monitor being operatively coupled to the processor, the ILD being interposed between the third and fourth conductive lines; wherein the processor determines the existence of a defect in the ILD based on the measured voltage correlated with the applied wavelength of the light beam.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 2c is a schematic representation of the partial system of FIG. 2a wherein a light beam is directed at a first portion of the ILD in accordance with the present invention;

FIG. 2d is a schematic representation of the partial system of FIG. 2a wherein a light beam is directed at a second portion of the ILD in accordance with the present invention;

DETAILED DESCRIPTION OF THE INVENTION

Figure 1:
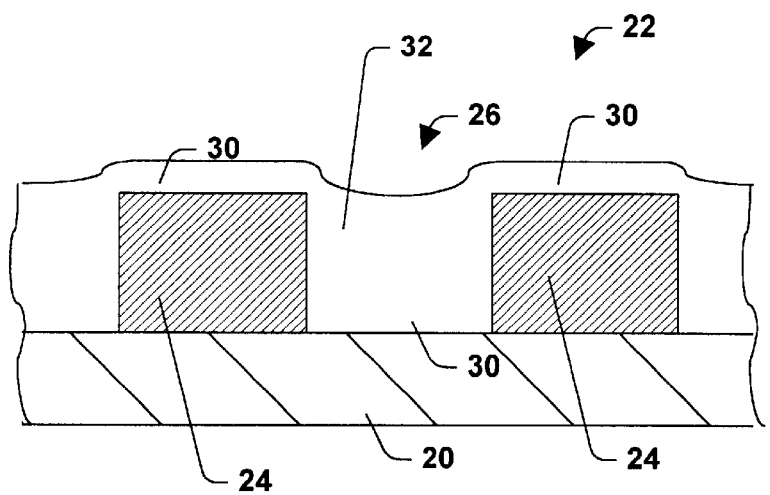
FIG. 1 is a schematic cross-sectional illustration of a portion of a semiconductor device fabricated in accordance with conventional techniques.

The present invention relates to a system and method for detecting defects in an ILD by inducing a leakage current between conductive lines across the ILD. The presence of defects in the ILD will change the amount of leakage current above or below an expected value depending upon the nature of the defect. By applying a magnetic field orthogonally to the leakage current and monitoring the level of Hall voltage produced in connection with the location of a light source being employed to enhance the leakage current, the location and nature of defect(s) in the ILD may be determined with substantial accuracy. Provided below is a more detailed description for carrying out this invention. The following detailed description is of the best modes presently contemplated by the inventors for practicing the invention. It should be understood that the description of these preferred embodiments are merely illustrative and that they should not be taken in a limiting sense.

The present invention will now be described with reference to the drawings, wherein like reference numerals are used to refer to like elements throughout.

Figure 2A:
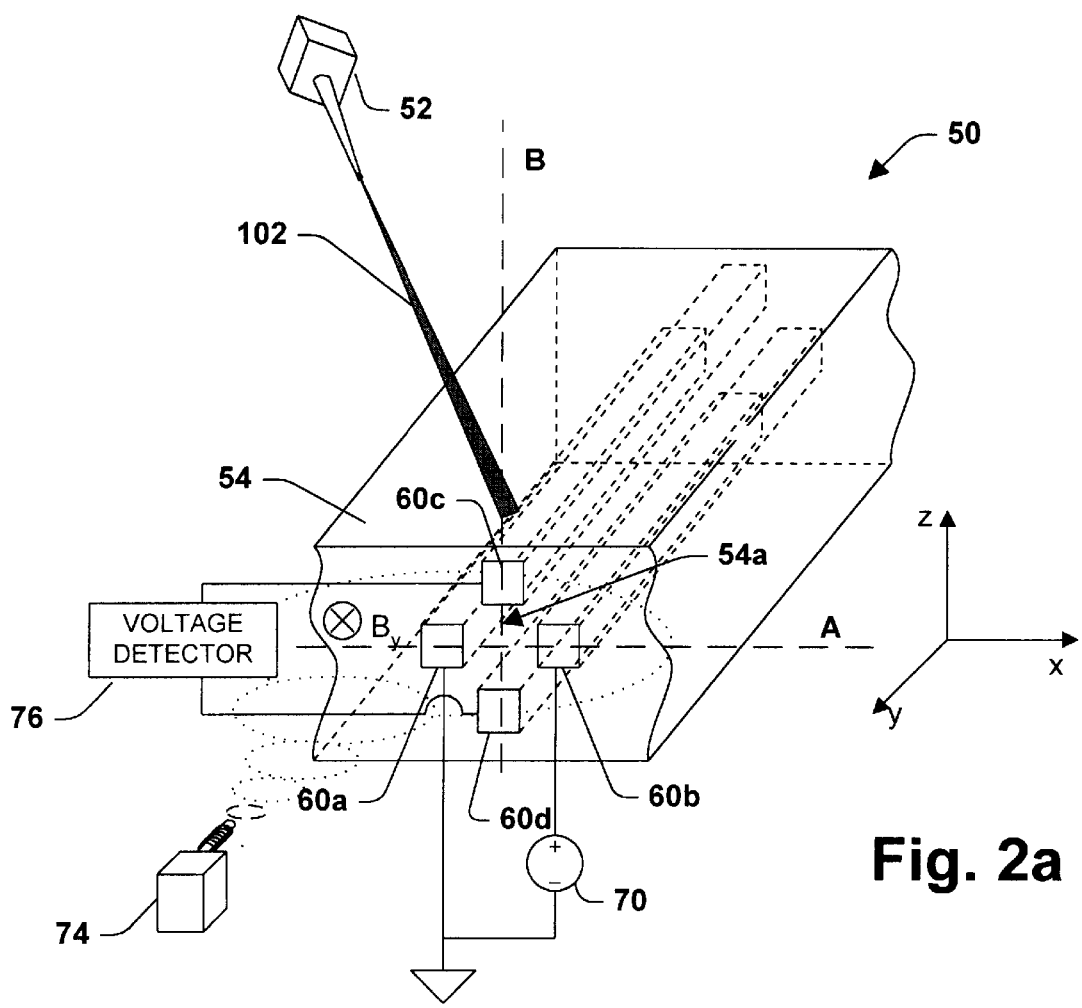
FIG. 2a is a schematic representation of part of a system for detecting defects in an ILD in accordance with the present invention.

Referring initially to FIG. 2a, a portion of a system 50 for carrying out the present invention is schematically illustrated. The system 50 includes a radiation or light source (e.g., ultraviolet laser) 52 for directing a light beam of substantially uniform intensity at a portion of an ILD layer 54 interposed between two conductive lines 60a, 60b. It will be appreciated that any radiation or light source suitable for carrying out the present invention may be employed and is intended to fall within the scope of the hereto appended claims. Preferably, the light source 52 emits light of a wavelength greater than the absorptive wavelength of the ILD 54 so that the light penetrates deep enough into the ILD 54 to excite carriers therein.

The conductive lines 60a, 60b are part of a conductive pattern formed over the insulating/substrate layer 64. Preferably a metalization pattern is formed by depositing a metalization layer and patterning employing suitable photolithographic and etching techniques (e.g., anisotropic etching such as reactive ion etching). The conductive pattern may be deposited by any of a variety of suitable deposition techniques, such as chemical vapor deposition (CVD) processes including low pressure chemical vapor deposition (LPCVD) and plasma enhanced chemical vapor deposition (PECVD), melting or sputtering. The conductive lines may include any suitable material (e.g., aluminum) for carrying out the present invention. Typically, the IC will include multiple layers of conductive lines, and conductive lines 60c and 60d are representative of two additional layers of conductive lines, one layer above the conductive lines 60a, and 60b and another layer below the conductive lines 60a, and 60b, respectively.

Conductive lines 60a, and 60b represent a first set of conductive lines which are adjacent to each other and lie along a plane which includes axis "A", and run perpendicular to the axis "A"., Conductive lines 60c and 60d represent a second set of conductive lines which lie adjacent each other and lie along a plane which includes axis "B", and run perpendicular to the axis "B". Axis "B" is substantially perpendicular to axis "A". The present invention provides for detecting defects in an area of the ILD 54 which interposes both sets of conductive lines 60a, 60b and 60c, 60d.

The conductive lines 60a, 60b are adjacent each other and provide necessary electrical connections between devices of an integrated circuit (not shown). Although only four conductive lines 60a, 60b, 60c and 60d are shown for ease of understanding, it is to be appreciated that many thousands or even millions more such conductive lines may exist in the integrated circuit. As noted above, the increasing demand for miniaturization in the integrated circuits industry has lead to an ever constant reduction in separation between the conductive lines 60a, 60b, 60c and 60d in order to reduce IC size. However, the reduced spacing between the conductive lines 60a, 60b, 60c and 60d has the undesirable effect of possibly increasing the capacitance of whatever material lies between the conductive lines 60a, 60b, 60c and 60d to result in capacitive crosstalk between adjacent conductive lines. It is to be appreciated that in another embodiment of the invention, lines 60c and 60d may be for testing purposes only and not functional for purposes of driving the IC.

The system 50 of the present invention provides for detection of such defects during in-line processing before a substantial amount of monies and man hours have been expended toward fabricating the integrated circuit. The system 50 further includes a voltage source 70 for inducing a leakage current between the conductive lines 60*a*, 60*b* across the portion of ILD 54*a* (FIG. 2*a*) interposed between the conductive lines 60*a*, 60*b*. Preferably, the voltage source 70 applies a bias voltage (e.g., 3 eV) close to the final operating voltage of the resultant IC and desirably below the breakdown voltage of the resultant IC so as to avoid breakdown of various components of the pre-fabricated IC.

A magnetic field source 74 applies a magnetic field in a direction orthogonal to the direction of leakage current flow (which is between the conductive lines 60*a*, and 60*b*). Preferably, the magnetic field source 74 is an electro-magnet which provides a consistent desired magnetic field. However, it is to be appreciated that any suitable magnetic field source (e.g., permanent magnet, solenoid, coil) may be employed to carry out the present invention and is intended to fall within the scope of the hereto appended claims. In accordance with the Hall-effect, the magnetic field deflects carriers either towards conductive line 60*c* or 60*d* depending on the direction of flow of the leakage current. The deflected carriers will result in an accumulation of charge in the vicinity of one of the conductive lines 60*c* or 60*d* which may be measured as a Hall voltage across the two conductive lines 60*c* and 60*d*. The measured Hall voltage will be indicative of the state of the ILD (e.g., defect free, including defects). A voltage monitor 76 is operatively coupled to the two conductive lines 60*c* and 60*d* to measure the Hall voltage.

Figure 2B:
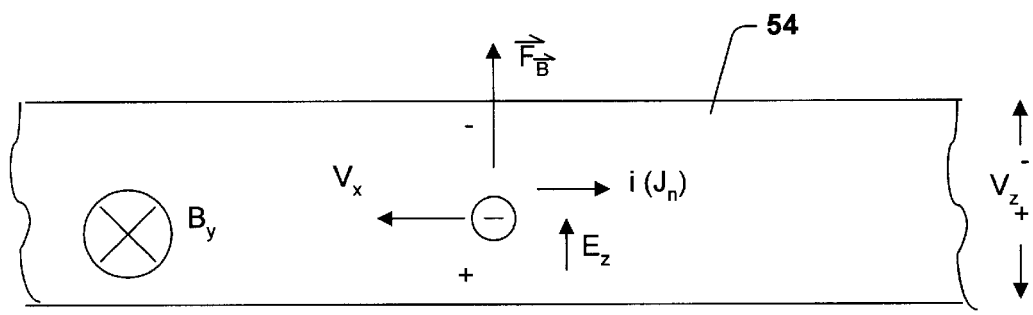
FIG. 2b is a cross section diagram illustrating the Hall-effect, and how a magnetic field applied perpendicular to a current flowing through an ILD will exert a force on a carrier traveling through the ILD in accordance with the present invention.
Figure 2B:
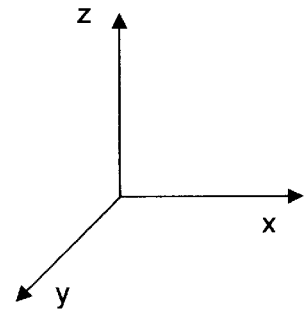

Turning briefly to FIG. 2*b*, the Hall-effect is discussed in greater detail. The force exerted on a particle in the presence of an electric and magnetic field is called the Lorentz force and is represented by:

$$F = q(E + v \times B),$$

wherein E is the electric field vector, B is the magnetic field vector and v is the charged particle velocity vector (which in the case of the present invention is in a direction opposite to the direction of current flow). As can be seen by the above equation, the force exerted by the magnetic field component is in a direction perpendicular to the flow of current if the magnetic field is oriented in a direction perpendicular to the direction of current flow since the magnetic force component ($qv \times B$) is determined by the "curl" of the velocity vector and the magnetic field vector. As illustrated in FIG. 2*a*, if the current (i) is in the positive "x" direction (and thus the velocity vector is in the negative "x" direction) and the magnetic field $B_y$ is directed perpendicularly into the page, then, according to the "right hand rule", the force exerted on the particle due to the magnetic field will be in the positive "z" direction, thus deflecting the particle in the positive "z" direction.

The Hall-effect employs this particle deflection principle. In general, the Hall- effect can be summarized as follows: a material containing a current flowing in the presence of an orthogonal magnetic field will result in a potential difference developing across the material. This can be easily seen in FIG. 2*a*. When the magnetic field deflects a carrier (whether positive or negative) towards conductive line 60*c* (FIG. 2*a*), an accumulation of charge develops in the vicinity of conductive line 60*c* which is proportional to the number of carriers in the ILD 112 at that vicinity. The accumulation of charge thus results in the development of a voltage potential ($V_Z$) between conductive lines 60*c* and 60*d*, which is referred to as the Hall voltage. The measured Hall voltage being indicative of the state (e.g., defect free or including defects) of the ILD 54.

A processor 100 (FIG. 3*a*) is employed to monitor the Hall voltage. The processor 100 also controls the light source 52 so as to control the portion of the ILD 54 being illuminated and the energy level of the light being applied to the ILD 54. The light source 52 provides for enhancing the flow of the leakage current at the ILD portion being tested for defects. More particularly, by applying light with an energy level greater than the energy-barrier between the metal of the conductive lines 60*a*, 60*b* and the dielectric carriers are injected into the dielectric from the metal in accordance with the photo hall-effect. The photo hall-effect is a well known phenomenon and thus detailed discussion related thereto is omitted for sake of brevity. The leakage current flow is enhanced.

Thus, by selectively directing a light beam 102 at a portion of the ILD 54 and comparing the Hall voltage to an expected value, the system 50 can determine if a defect exists in the ILD 54 at the portion. Furthermore, by dividing the ILD 54 into a grid map of such ILD portions and selectively scanning the light beam 102 from one grid block to another grid block and taking corresponding Hall voltage measurements, the present invention can determine the location and nature of such defects with substantial accuracy. FIG. 2*c* illustrates the light beam 102 being directed at a first location of the ILD 54 and FIG. 2*d* illustrates the light beam 102 being directed at a second location of the ILD 54. Hall voltage measurements are taken at each location when the locations are being illuminated, respectively.

Figure 3A:
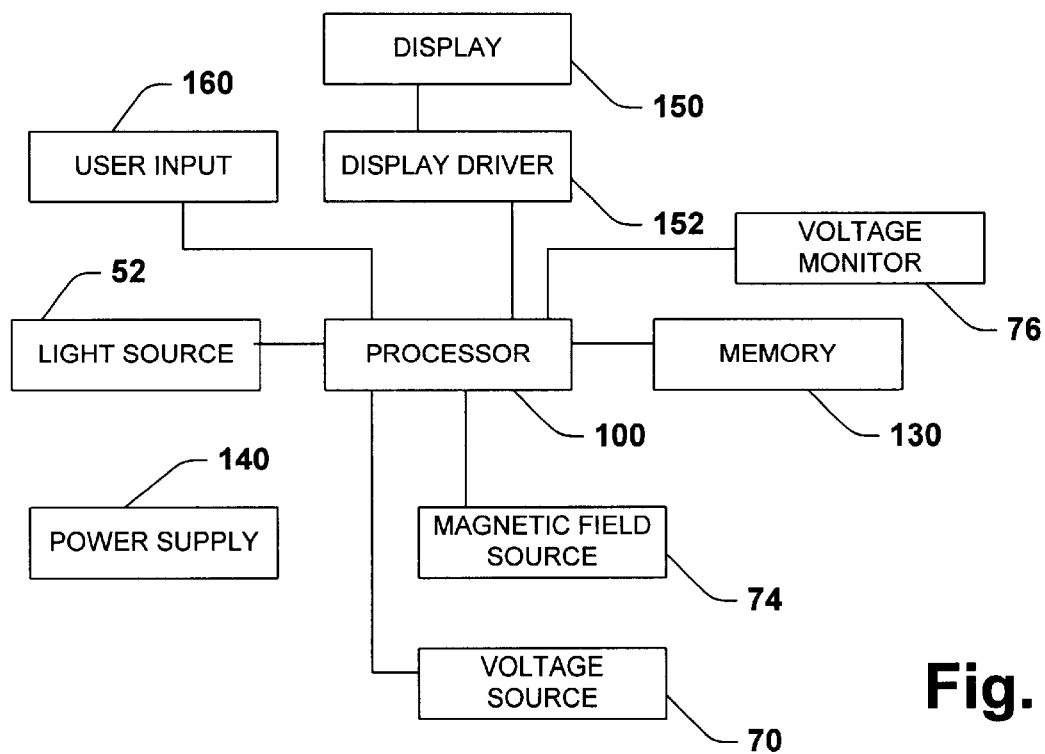
FIG. 3a is a schematic block diagram of a system for detecting defects in an ILD in accordance with the present invention.

Turning now to FIG. 3*a*, a representative block diagram of the system 50 is shown and will now be discussed. The system 50 includes the processor 100 which is programmed to control and operate the various components within the system 50 in order to carry out the various functions described herein. The processor or CPU 100 may be any of a plurality of processors, such as the AMD K6 and other similar and compatible processors. The manner in which the processor 100 can be programmed to carry out the functions relating to the present invention will be readily apparent to those having ordinary skill in the art based on the description provided herein.

A memory 130 which is coupled to the processor 100 is also included in the system 50 and serves to store program code executed by the processor 100 for carrying out operating functions of the system 50 as described herein. The memory 130 includes read only memory (ROM) and random access memory (RAM). The ROM contains among other code the Basic Input-Output System (BIOS) which controls the basic hardware operations of the system 50. The RAM is the main memory into which the operating system and application programs are loaded. The memory 130 also serves as a storage medium for temporarily storing information such as Hall voltage values, light beam 102 location, light beam intensity, magnetic field intensity, expected Hall voltage tables, and other data which may be employed in carrying out the present invention. For mass data storage, the memory 130 may include a hard disk drive (e.g., 10 Gigabyte hard drive).

The system 50 includes a power supply 140 which provides power to the system 50. Connections between the power supply 140 and other components of the system 50 are not shown for ease of understanding the present invention. Any suitable device or means (e.g., battery, line power) for powering the system 50 may be employed.

The system 50 includes a display 150 which is coupled to the processor 100 via a display driver circuit 152 as is conventional. The display 150 may be a color monitor or a flat screen liquid crystal display (LCD) or the like. The display 150 may be a fine pitch liquid crystal display operated as a standard CGA display with a suitable resolution. The display 150 functions to display data or other information relating to ordinary operation of the system 50. For example, the display 150 may display a set of discrete induced leakage current values for various portions of the ILD 54. Additionally, the display 150 may display a variety of functions indicating the operation of the system 50. The display 150 is capable of displaying both alphanumeric and graphical characters.

An operator input system 160 (e.g., keyboard and mouse) is also coupled to the processor 100, and provides for a user to interact with the system 50 as is well known in the art.

Figure 3B:
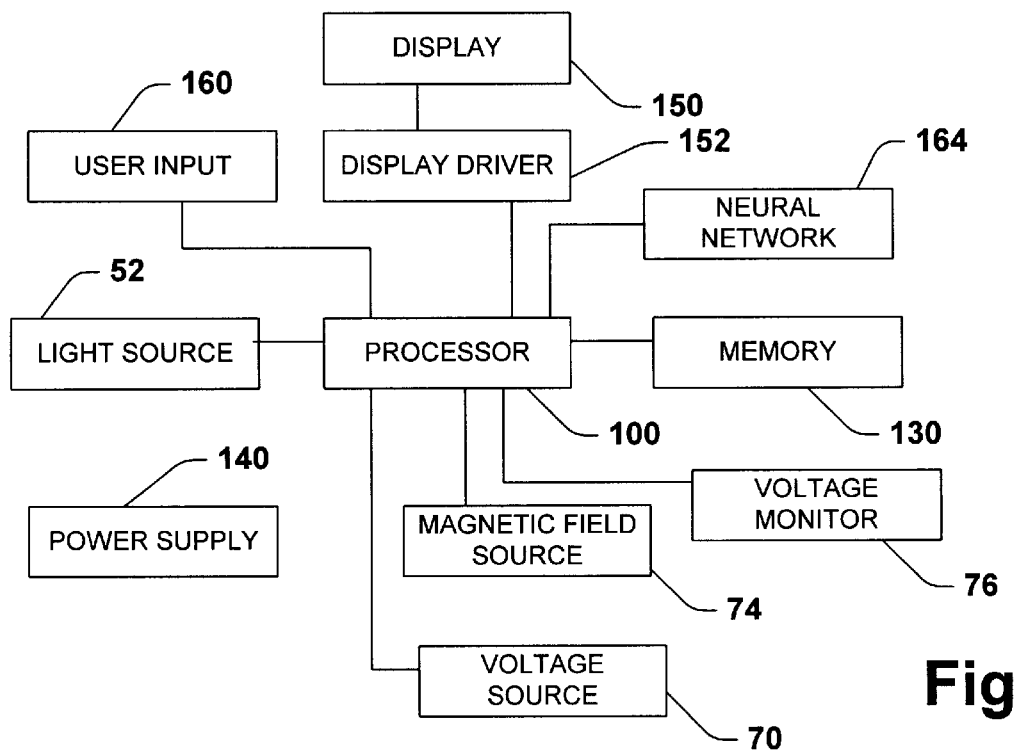
FIG. 3b is a schematic block diagram of another system for detecting defects in an ILD in accordance with the present invention.
Figure 3C:
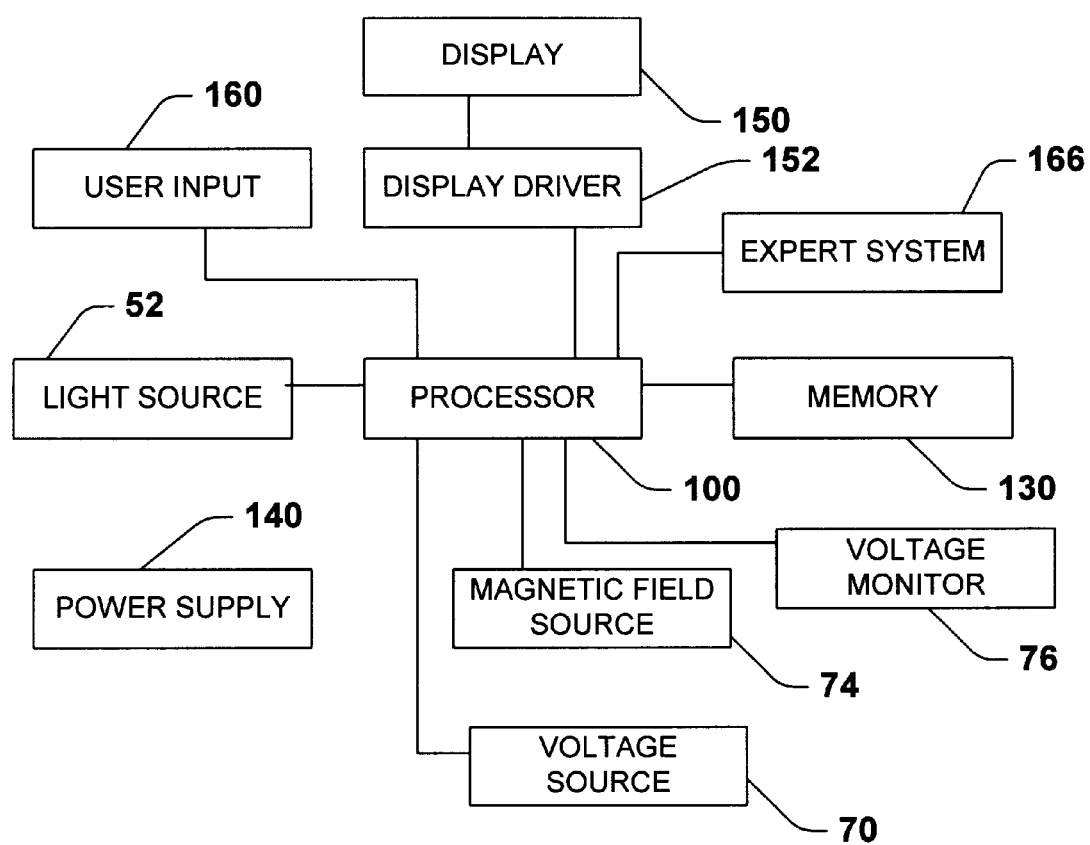
FIG. 3c is a schematic block diagram of yet another system for detecting defects in an ILD in accordance with the present invention.

The system 50 may employ a neural network 164 (FIG. 3b) to facilitate data analysis and processing. The use of neural networks is well known in the art and thus further discussion relating thereto is omitted for sake of brevity. Alternatively, the system 50 may employ an expert system 166 (FIG. 3c) to facilitate data analysis and processing. Expert systems provide for classification based on inference to derive more knowledge about a subject and in turn employ logical reasoning in making a decision.

The voltage source 70, magnetic field source 74 and Hall voltage monitor 76 have been discussed above and detailed discussion related thereto is omitted for sake of brevity. It will be appreciated that any Hall voltage monitor and/or voltage source suitable for carrying out the present invention may be employed and are intended to fall within the scope of the hereto appended claims. Furthermore, although the preferred embodiment employs the Hall voltage monitor 76 to monitor the level of Hall voltage it is to be appreciated that one may monitor power levels, etc. which are functions of the level of leakage current and/or Hall voltage. Such monitoring of parameters which are a function of or related to the leakage current and/or Hall voltage are intended to be considered to fall within the scope of the present invention as defined by the claims.

Figure 3D:
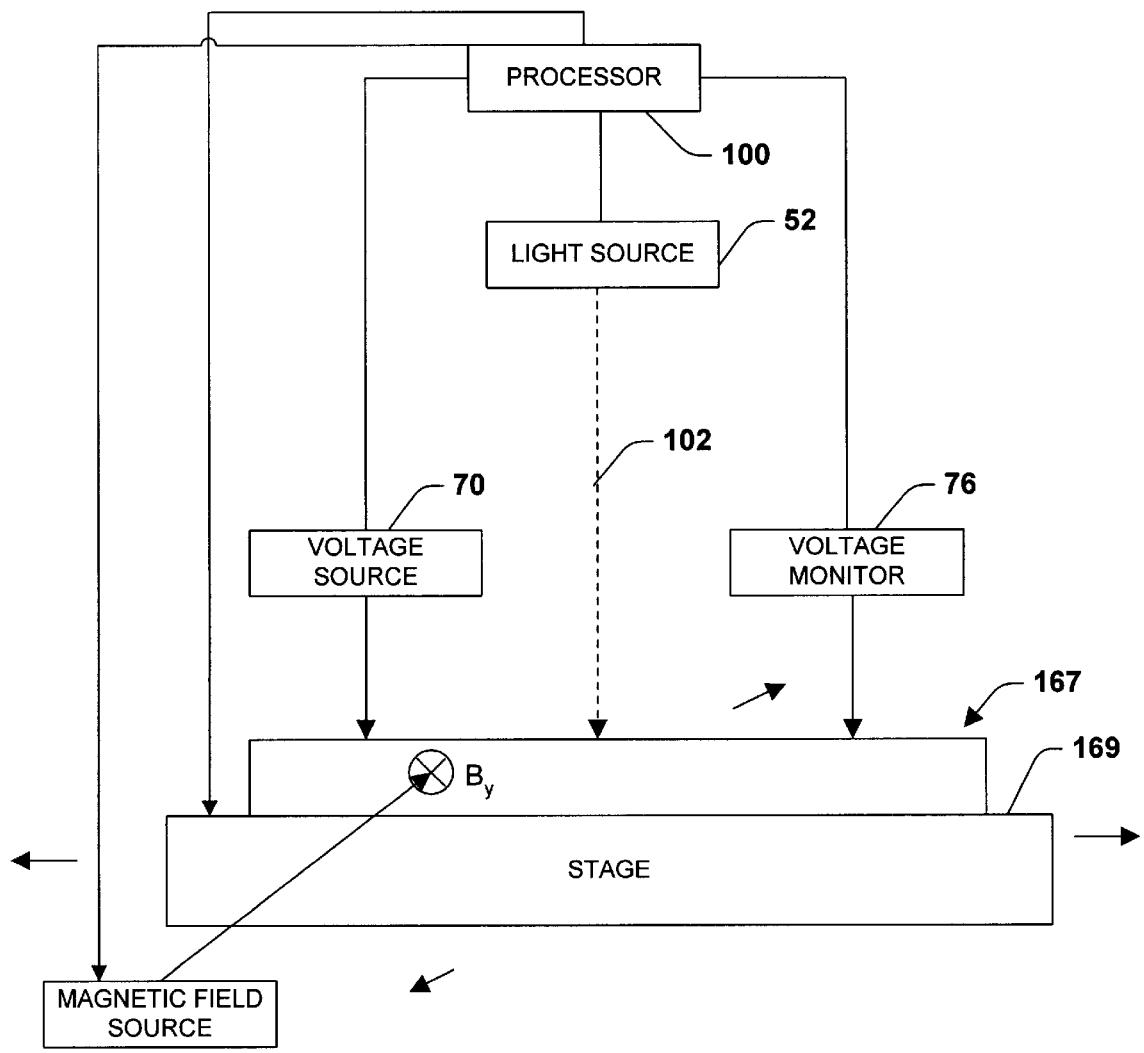
FIG. 3d is a schematic block diagram illustrating a system for directing a light beam at a selected portion of a device being tested in accordance with the present invention.
Figure 3E:
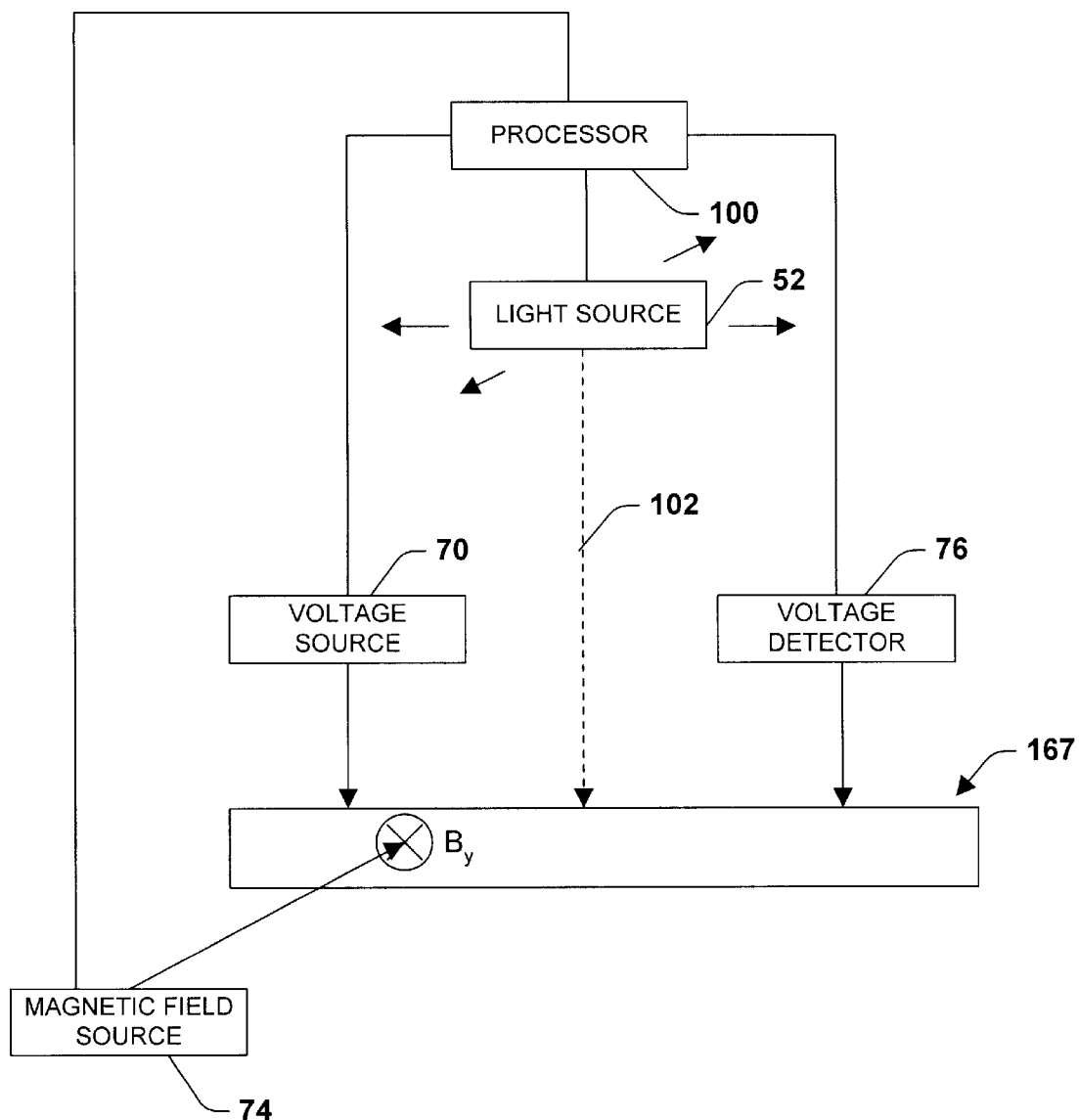
FIG. 3e is a schematic block diagram illustrating another system for directing a light beam at a selected portion of a device being tested in accordance with the present invention.

FIG. 3d is a schematic block illustration of one technique for directing the light beam 102 at a desired portion of the ILD 54. A device 167 being tested for defects is placed on a moveable stage 169 which may be controlled by the processor 100. The processor 100 selectively controls movement of the stage 169 along a horizontal plane so that the light beam 102 is directed at a desired portion of the ILD 54. Alternatively, as shown in FIG. 3e rather than moving the device 167 being tested the processor 100 may control movement of the light source 52 and/or beam 102 so that the light beam 102 is directed at a desired portion of the ILD. It is to be appreciated that any suitable technique and/or device for directing the light beam 102 at a selected portion of the ILD 54 may be employed and is intended to fall within the scope of the attached claims.

Figure 4A:
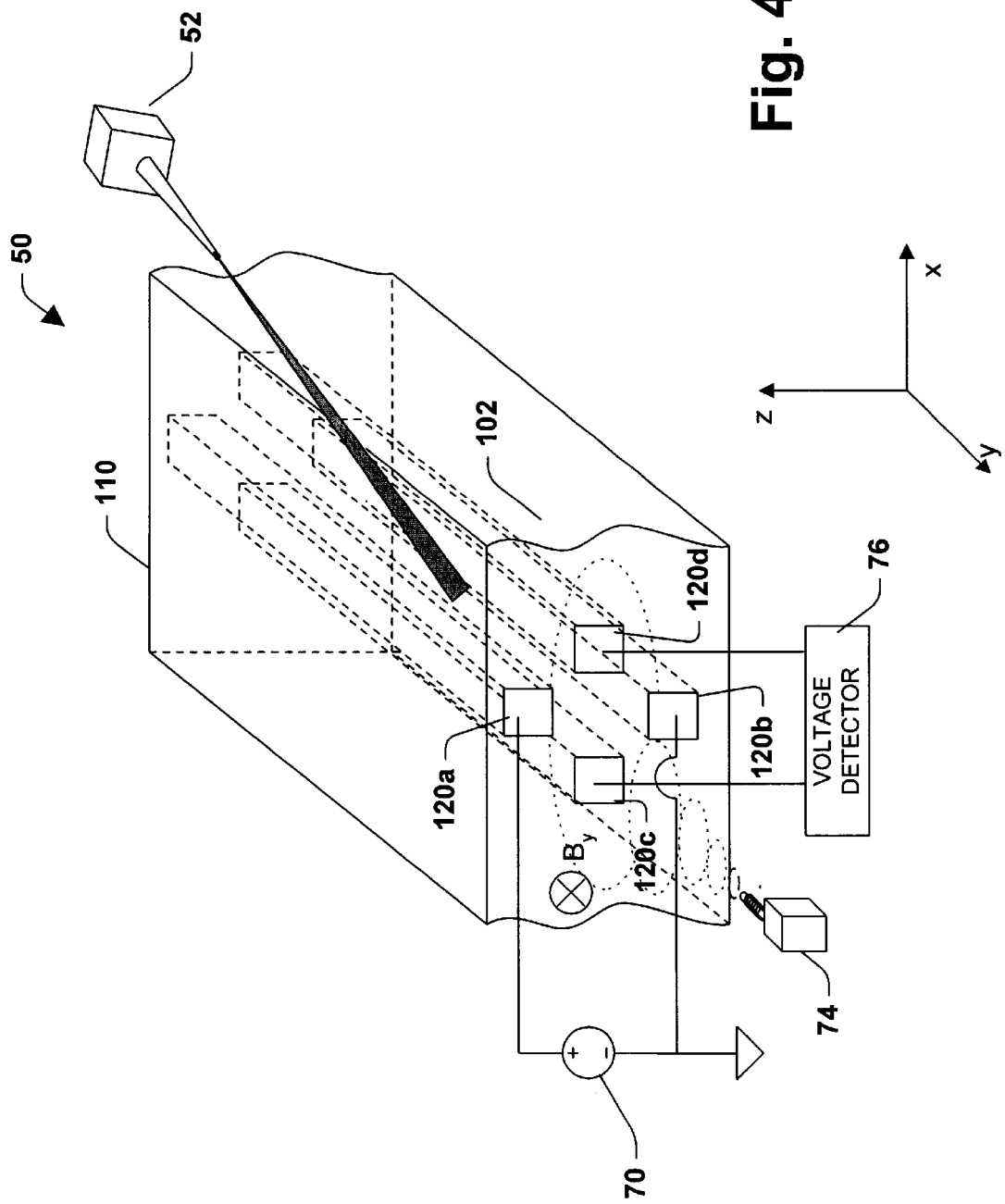
FIG. 4a is a schematic representation of part of a system for detecting defects in an ILD interposed between a first set of two vertically adjacent conductive lines in accordance with the present invention.
Figure 4B:
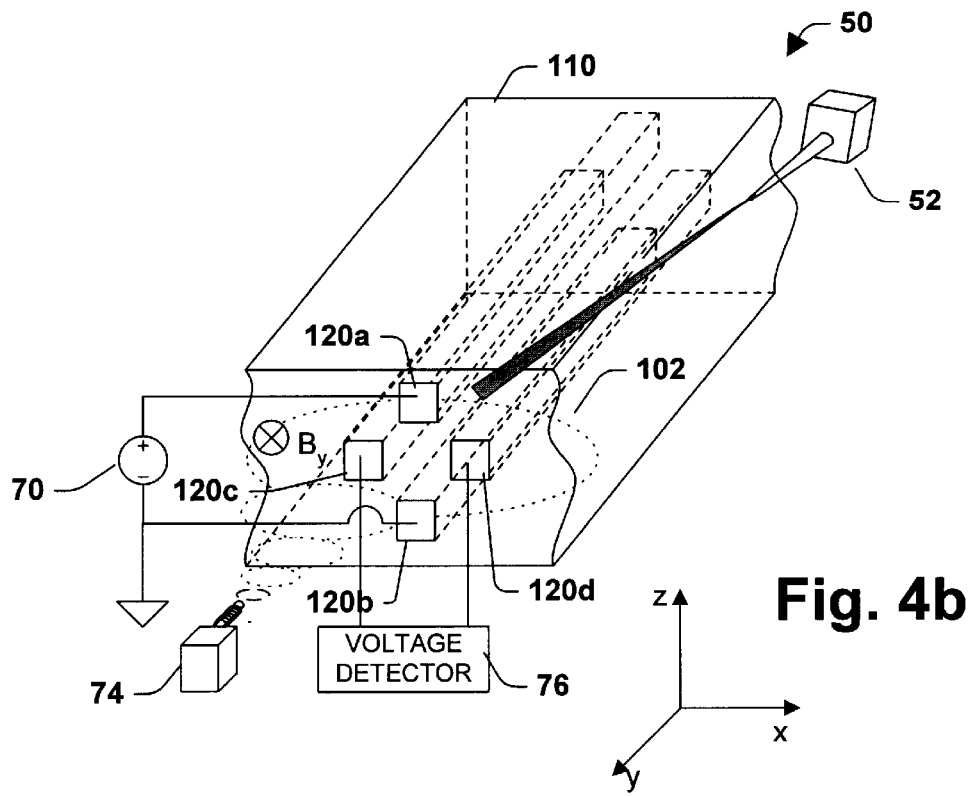
FIG. 4b is a schematic representation of the partial system of FIG. 4a wherein a light beam is directed at a first portion of the ILD in accordance with the present invention.
Figure 4C:
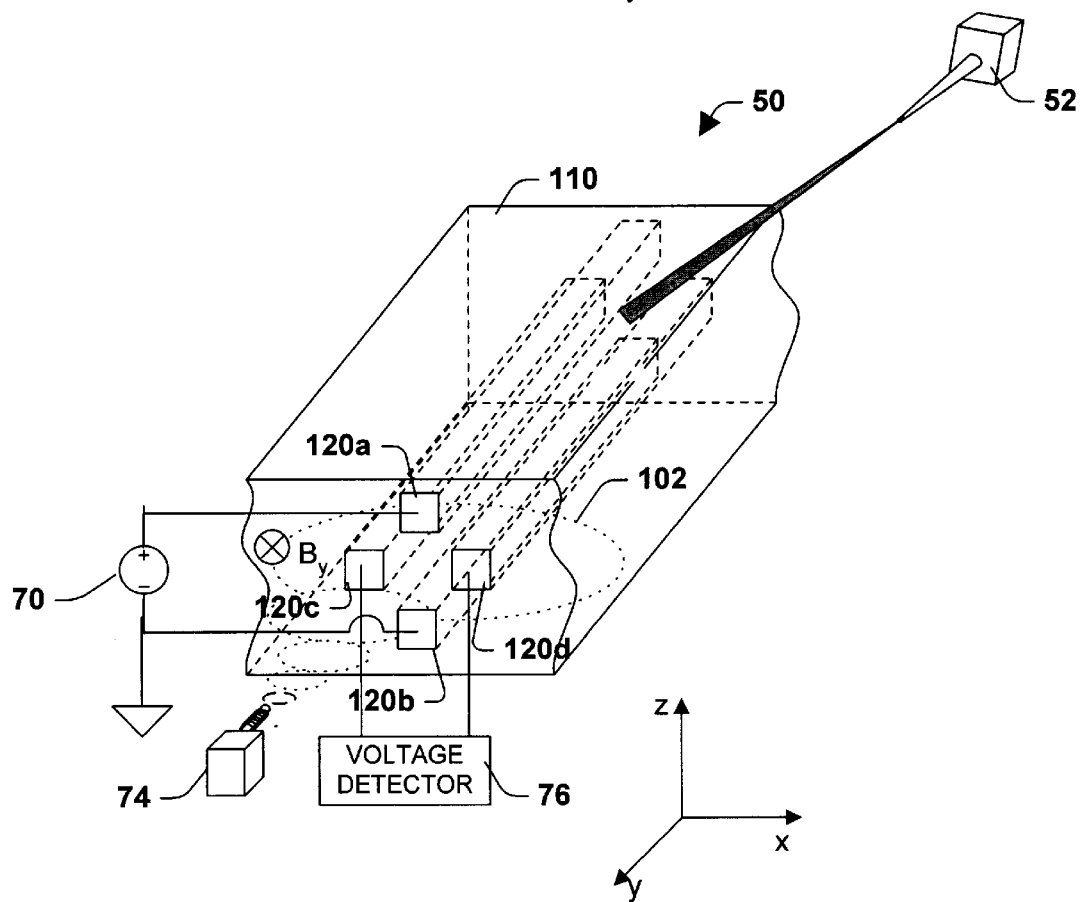
FIG. 4c is a schematic representation of the partial system of FIG. 4a wherein a light beam is directed at a second portion of the ILD in accordance with the present invention.

FIGS. 4a–4c illustrate the system 50 of the present invention being employed to determine if any defects exist in an ILD 110 interposed between two vertically adjacent conductive lines 120a, 120b. As shown in FIGS. 4b and 4c, the light beam 102 may be directed at different portions of the ILD 110 and Hall voltage measurements taken along lines 120c and 120d. By dividing up the ILD 110 into a sufficient number of portions (e.g., grid blocks), the present invention can determine the location and nature of defects in the ILD 110 with substantial accuracy as described herein.

Figures 5, 6:
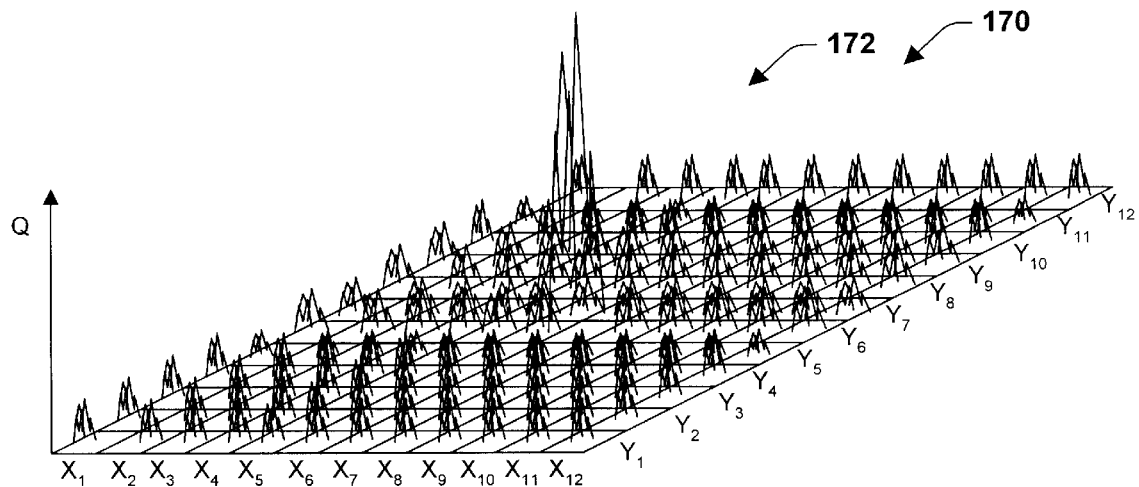
FIG. 5 is a representative three-dimensional grid map of a portion of an ILD illustrating accumulated charge amplitudes taken at grid blocks of the grid map in accordance with the present invention.
FIG. 6 is an accumulated charge amplitude table correlating the charge amplitudes of FIG. 5 with expected values for the charge amplitudes in accordance with the present invention.

Turning now to FIG. 5 a three-dimensional representative illustration of a section of the ILD 54 divided into grid blocks 170 is shown which may be displayed on the display 150. The section of the ILD 54 is shown divided, for example, into one hundred and forty four grid blocks 170 along an X–Y plane which make up a grid map 172. The grid 172 includes twelve x-segments and twelve y-segments and thus is divided up into the grid blocks ($X_1Y_1$ through $X_{12}Y_{12}$) 170. Each grid block 170 is representative of a portion of the ILD 54 where the light beam is directed to enhance the leakage current flowing between conductive lines (e.g., 60a, 60b) across the ILD 54 between the conductive lines. Each grid block 170 is shown with a corresponding charge accumulation amplitude signature taken when the light beam 102 was directed thereon respectively. As can be seen, the charge accumulation amplitude at each grid block is substantially the same (e.g., within an expected range) except for the charge accumulation amplitude at grid block $X_7Y_6$. The charge accumulation amplitude at grid block $X_7Y_6$ is larger than the charge accumulation amplitude measured at the other grid blocks, respectively. Thus, a defect is likely to exist in the ILD 54 at the portion mapped by grid block $X_7Y_6$. Since the charge accumulation amplitude is larger than expected the defect is likely of the type which results in trapping sites in the ILD 54.

FIG. 6 is a representative table of charge accumulation amplitudes (taken at the various grid blocks 170 when the light beam 102 was directed thereon) which have been correlated with expected charge accumulation amplitude values for the portions of the ILD 54 mapped by the respective grid blocks 170. As can be seen, all of the grid blocks 170 except grid block $X_7Y_6$ have charge accumulation amplitudes corresponding to an expected charge accumulation value ($Q_E$) (e.g., are within an expected range of charge accumulation amplitudes), while grid block $X_7Y_6$ has an unexpected charge accumulation value ($Q_U$). Thus, the processor 100 has determined that a defect is likely to exist at the portion of the ILD 54 mapped by grid block $x_7y_6$.

If the charge accumulation amplitude is above an expected range a defect in the ILD (e.g., lattice defect, impurity, dislocation, ion contaminant) which likely leads to the formation of a trapping site may exist. If the charge accumulation amplitude is below an expected range a defect in the ILD such as a void, for example, may exist. It is to be appreciated that the memory 130 may store a plurality of tables which match particular charge accumulation signatures to various defects, and the processor 100 may access such tables to diagnose the type of defect that may exist. The use of the neural network 164 or expert system 166 may expedite grid analysis and defect diagnosis.

Figure 7:
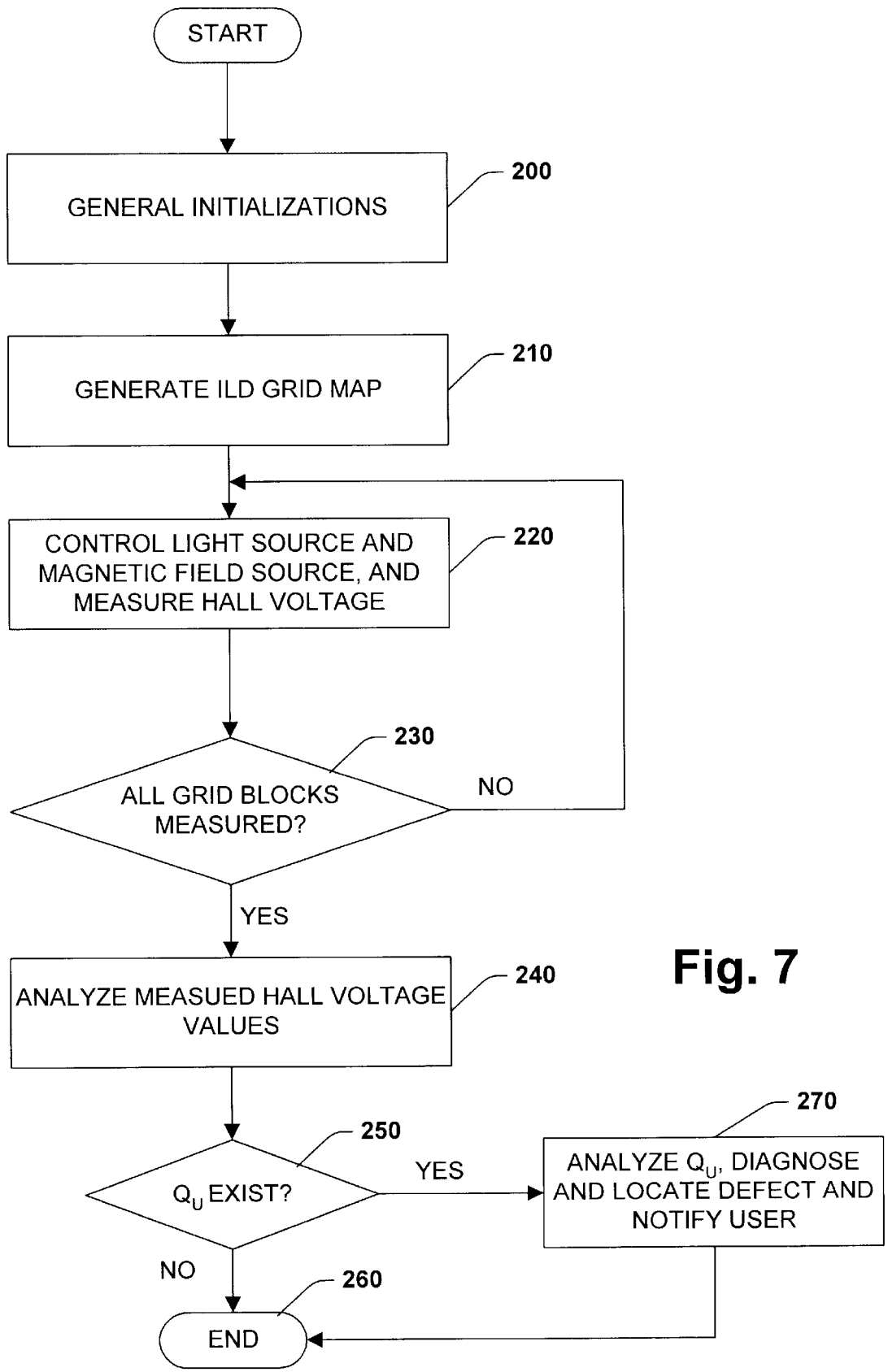
FIG. 7 is a flow diagram illustrating one specific methodology for carrying out the present invention.

FIG. 7 is a flow diagram illustrating one particular methodology for carrying out the present invention. In step 200, the processor 100 performs general initializations to the system 50. In step 210, the processor 100 maps at least a portion of the ILD 54 between two conductive lines 60a, 60b into a plurality of grid blocks 170. In step 220, the processor 100 controls the voltage source 70 so as to apply a bias voltage between the two conductive lines 60a, 60b. In step 220, the processor 100 causes the light source 52 to direct the light beam 102 on a first grid block so as to facilitate inducement of a leakage current between the two conductive lines 60a, 60b, and the processor 100 measures the Hall voltage across conductive lines 60c and 60d as the light beam is directed on the first grid block. This step is repeated "N" number of times until Hall voltage measurements have been taken corresponding to the light beam being directed on all "N" number of grid blocks, wherein "N" is an integer.

In step 230, the processor 100 determines if "N" number of Hall voltage measurements have been taken. If yes, the processor 100 proceeds to step 240 where the measured Hall voltage values are compared against a range of expected Hall voltage values. In step 250, the processor 100 determines if any unexpected Hall voltage values exist. If no, the processor 100 proceeds to step 260 where the testing process is complete. If yes, the processor 100 analyzes the unexpected Hall voltage value, determines the grid block location of the defect, diagnoses the defect, determines the location of the defect, and notifies a user of the system 50 that a defect may exist, the location on the ILD 54 where the possible defect may reside and the probable nature of the defect (e.g., lattice defect, impurity, contaminant, dislocation, void). Then, the processor 100 proceeds to step 260 where the ILD test is complete in relevant part.

It is to be appreciated that another embodiment of the present invention may be employed to detect the location of a defect in the ILD 54 in a three-dimensional manner. More particularly, by selectively varying the wavelength of the light beam 102 being directed at the ILD 54, the depth of penetration of the light beam 102 into the ILD 54 may be controlled. By systematically varying the depth of penetration of the light beam 102 into the ILD 54 and taking Hall voltage measurements as described above, not only may the location of a defect be detected along an x-y plane but the depth of the defect along the z-axis may be determined as well.

The present invention provides for a system and method which quickly detects defects in an ILD in a non-destructive manner during in-line processing with substantial resolution and accuracy.

What has been described above are preferred embodiments of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A system for detecting defects in an interlayer dielectric (ILD) interposed between a first set of conductive lines lying adjacent each other along a first plane, comprising:
   a processor for determining the presence of a defect in the ILD;
   a leakage current inducement system for inducing a leakage current between the first set of conductive lines across the ILD;
   a magnetic field source for applying a magnetic field in a direction orthogonal to the leakage current;
   a monitor operatively coupled to the processor, the monitor monitoring a parameter at least related to the leakage current across a second set of conductive lines lying adjacent each other along a second plane, the second plane being substantially perpendicular to the first plane, the ILD being interposed between the second set of conductive lines;
   wherein the processor determines the presence of a defect in the ILD based upon the monitored parameter.

2. The system of claim 1, the parameter being a Hall voltage amplitude.

3. The system of claim 1, the parameter being a charge accumulation profile that is a function of the leakage current.

4. The system of claim 1, the parameter being a power value that is a function of the leakage current.

5. The system of claim 1, the leakage current inducement system including a voltage source for generating a bias voltage between the first set of conductive lines.

6. The system of claim 1, the leakage current inducement system including a light source for generating a photo hall-effect.

7. The system of claim 6, the light source being an ultraviolet laser.

8. The system of claim 1, wherein the processor maps the ILD into a plurality of grid blocks, and the monitor takes at least one measurement of the parameter at each grid block.

9. The system of claim 8, wherein the processor determines the existence of a defect in the ILD based upon the measured parameter differing from an expected value.

10. The system of claim 9, wherein the processor determines the location of the defect by mapping the grid blocks to the ILD.

11. A system for detecting defects in an interlayer dielectric (ILD) interposed between first and second conductive lines lying adjacent each other along a first plane, comprising:
    a processor for controlling general operations of the system;
    a voltage source adapted to apply a bias voltage between the first and second conductive lines and induce a leakage current across the ILD;
    a light source for illuminating at least a portion of the ILD and enhancing the leakage current;
    a magnetic field source for applying a magnetic field in a direction orthogonal to the leakage current, the magnetic field deflecting carriers in a direction substantially perpendicular to the first plane;
    a voltage monitor for measuring a voltage generated across third and fourth conductive lines, the third and fourth conductive lines lying adjacent each other along a second plane which is substantially perpendicular to the first plane, the voltage monitor being operatively coupled to the processor, the ILD being interposed between the third and fourth conductive lines;
    wherein the processor determines the existence of a defect in the ILD based on the measured voltage.

12. The system of claim 11, wherein the light source is an ultraviolet laser.

13. The system of claim 11, the processor mapping the ILD to a plurality of grid blocks and analyzing measured leakage current values at each grid block.

14. The system of claim 11, the processor coordinating illumination of each grid block of ILD with measuring voltage values at each respective grid block.

15. The system of claim 14, the processor analyzing the measured voltage values taken at each ILD grid block and determining the presence of a defect in the ILD by cross-referencing the measured voltage current values against a range of expected voltage values.

16. The system of claim 15, wherein the processor determines the nature of the defect based upon the measured voltage value being above or below the range of expected voltage values.

17. The system of claim 11 further including a neural network to facilitate the processor determining the presence of the defect.

18. The system of claim 11 further including an expert system to facilitate the processor determining the presence of the defect.

19. A method for detecting defects in an interlayer dielectric (ILD) interposed between first and second conductive lines, comprising the steps of:
    inducing a leakage current between the two conductive lines across the ILD;

applying a magnetic field in a direction orthogonal to the leakage current so as to generate a Hall voltage across third and fourth conductive lines;

measuring the Hall voltage value; and determining the presence of a defect based on the measured Hall voltage.

20. The method of claim 19, the step of inducing a leakage current including using a light source to excite carriers via a the photo hall-effect.

21. The method of claim 19 further including the step of mapping the ILD to a grid map and measuring the Hall voltage at a first grid block on the grid map and a second grid block on the grid map, and determining the presence of a defect at either of the first grid block and the second grid block.

22. The method of claim 21 further including the step of using the grid map to facilitate determining the location of a defect present in the ILD.

23. The method of claim 22 further including the step of analyzing the measured Hall voltage against an expected value to determine the existence of the defect.

24. The method of claim 23 further including the step of analyzing the measured Hall voltage against a range of expected Hall voltage values to determine the nature of the defect.

25. A system for detecting defects in an interlayer dielectric (ILD) interposed between two conductive lines, comprising:

means for inducing a leakage current between the two conductive lines across the ILD;

means for applying a magnetic field orthogonal to the leakage current so as to generate a Hall voltage across two elements;

means for monitoring the Hall voltage generated by the magnetic field; and means for determining the presence of a defect in the ILD based upon the monitored Hall voltage.

26. The system of claim 25 further including means for enhancing the leakage current level.

27. The system of claim 26, the means for enhancing the leakage current including radiation means.

28. The system of claim 26, the means for enhancing the leakage current including light source means.

29. A system for detecting a three-dimensional location of defects in an interlayer dielectric (ILD) interposed between first and second conductive lines lying adjacent each other along a first plane, comprising:

a processor for controlling general operations of the system;

a voltage source adapted to apply a bias voltage between the first and second conductive lines and induce a leakage current across the ILD;

a light source for illuminating at least a portion of the ILD and enhancing the leakage current, the light source being selectably adjustable to incrementally apply a light beam at a desired wavelength from among a plurality of wavelengths;

a magnetic field source for applying a magnetic field in a direction orthogonal to the leakage current, the magnetic field deflecting carriers in a direction substantially perpendicular to the first plane;

a voltage monitor for measuring a voltage generated across third and fourth conductive lines, the third and fourth conductive lines lying adjacent each other along a second plane which is substantially perpendicular to the first plane, the voltage monitor being operatively coupled to the processor, the ILD being interposed between the third and fourth conductive lines;

wherein the processor determines the existence of a defect in the ILD based on the measured voltage correlated with the applied wavelength of the light beam.

* * * * *

UNITED STATES PATENT AND TRADEMARK OFFICE
CERTIFICATE OF CORRECTION

PATENT NO.: 6,177,802 B1

DATED: January 23, 2001

INVENTOR(S): Shabde, *et al.*

It is certified that errors appeared in the above-identified patent and that said Letters Patent is hereby corrected as shown below:

ON THE TITLE PAGE

Item [57]
At the beginning of the second to last sentence of the abstract: Please replace "The ILD is" with --The ILD being--.

In column 6, line 40: Please replace "A.," with --"A".--

In column 13, line 9: Please replace "a the" with --a--

Signed and Sealed this

Fifteenth Day of May, 2001

*Attest:*

NICHOLAS P. GODICI

*Attesting Officer*     *Acting Director of the United States Patent and Trademark Office*